(12) United States Patent
Firnkes et al.

(10) Patent No.: US 11,177,114 B1
(45) Date of Patent: Nov. 16, 2021

(54) ELECTRODE ARRANGEMENT, CONTACT ASSEMBLY FOR AN ELECTRODE ARRANGEMENT, CHARGED PARTICLE BEAM DEVICE, AND METHOD OF REDUCING AN ELECTRICAL FIELD STRENGTH IN AN ELECTRODE ARRANGEMENT

(71) Applicant: ICT Integrated Circuit Testing Gesellschaft für Halbleiterprüftechnik mbH, Heimstetten (DE)

(72) Inventors: Matthias Firnkes, Walpertskirchen (DE); Florian Lampersberger, Munich (DE); Carlo Salvesen, Massing (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 17/022,078

(22) Filed: Sep. 15, 2020

(51) Int. Cl.
| | | |
|---|---|---|
| *H01J 37/00* | (2006.01) | |
| *H01J 37/317* | (2006.01) | |
| *H01J 37/09* | (2006.01) | |
| *H01J 37/244* | (2006.01) | |
| *H01J 37/12* | (2006.01) | |

(52) U.S. Cl.
CPC .......... *H01J 37/3174* (2013.01); *H01J 37/09* (2013.01); *H01J 37/12* (2013.01); *H01J 37/244* (2013.01); *H01J 2237/04924* (2013.01)

(58) Field of Classification Search
USPC ..................................................... 250/396 R
See application file for complete search history.

(56) References Cited

U.S. PATENT DOCUMENTS

| | | | | |
|---|---|---|---|---|
| 3,867,668 | A * | 2/1975 | Shrader ................ | H01J 29/867 315/8 |
| 4,929,839 | A * | 5/1990 | Parker ................. | H01J 37/3007 250/398 |
| 5,059,859 | A * | 10/1991 | Endo ..................... | H01J 37/073 313/443 |
| 5,519,283 | A * | 5/1996 | Opresko ................ | H01J 29/96 313/479 |
| 8,502,311 | B2 * | 8/2013 | Theeuwen ............ | H01L 29/404 257/340 |
| 8,981,323 | B2 * | 3/2015 | Tanaka ................... | B82Y 10/00 250/492.3 |
| 10,032,755 | B2 * | 7/2018 | Domes ................... | H05K 7/209 |

\* cited by examiner

*Primary Examiner* — Phillip A Johnston
(74) *Attorney, Agent, or Firm* — Kilpatrick Townsend & Stockton LLP (57) ABSTRACT

An electrode arrangement for acting on a charged particle beam in a charged particle beam apparatus is described. The electrode arrangement includes a first electrode with a first opening for the charged particle beam; a first spacer element positioned in a first recess provided in the first electrode on a first electrode side for aligning the first electrode relative to a second electrode, the first spacer element having a first blind hole; a first conductive shield provided in the first blind hole; and a contact assembly protruding from the first electrode into the first blind hole for ensuring an electrical contact between the first electrode and the first conductive shield. Further, a contact assembly for such an electrode arrangement, a charged particle beam device with such an electrode arrangement, as well as a method of reducing an electrical field strength in an electrode arrangement are described.

20 Claims, 5 Drawing Sheets

ELECTRODE ARRANGEMENT, CONTACT ASSEMBLY FOR AN ELECTRODE ARRANGEMENT, CHARGED PARTICLE BEAM DEVICE, AND METHOD OF REDUCING AN ELECTRICAL FIELD STRENGTH IN AN ELECTRODE ARRANGEMENT

TECHNICAL FIELD

Embodiments described herein relate to an electrode arrangement for influencing a charged particle beam, such as an electron beam, in a charged particle beam device. A charged particle beam device may be an apparatus for imaging and/or inspecting a specimen with one or more charged particle beams, for example an electron microscope. Embodiments described herein particularly relate to an electrode arrangement for acting on a charged particle beam, a contact assembly for an electrode arrangement, and a charged particle beam device with an electrode arrangement. Embodiments further relate to methods of reducing an electrical field strength in an electrode arrangement of a charged particle beam device.

BACKGROUND

Charged particle beam devices have many functions in a plurality of industrial fields including, but not limited to, critical dimensioning of semiconductor devices during manufacturing, defect review of semiconductor devices, inspection of semiconductor devices, exposure systems for lithography, detecting devices and testing systems. Thus, there is a high demand for structuring, testing and inspecting specimens or samples on the micrometer and nanometer scale.

Improvements of charged particle beam devices, like electron microscopes or focused ion beam (FIB) devices, often depend on improvements of specific beam optical components. Beam optical components are, for example, electrostatic or magnetic lenses, deflectors, electrostatic or magnetic mirrors, detectors and spectrometers.

The beam optical components in a charged particle beam device are beneficially accurately aligned relative to each other, in order to allow for a propagation of the charged particle beam along a predetermined optical beam path with well-defined focusing, deflection and/or dispersion characteristics. For example, for an electrostatic lens including two or more electrodes with openings for the charged particle beam, said two or more electrodes are beneficially aligned relative to each other on a micrometer scale, such that the charged particle beam propagating through the openings is influenced exactly in a predetermined way by the electrostatic lens. Two adjacent electrodes can be aligned relative to each other by spacer elements, such as ceramic balls, that are arranged between the two adjacent electrodes and ensure a predetermined distance and relative positioning between the two adjacent electrodes.

During operation, one of the electrodes may be set on a high voltage potential relative to the other electrode. Arranging two electrodes at a close distance with spacer elements arranged therebetween may locally increase the electric field strength between the two electrodes, which increases the risk of arcing. Arcing may damage the beam optical components and may lead to inspection errors and other defects.

In view of the above, it would be beneficial to provide an electrode arrangement for acting on a charged particle beam that overcomes at least some of the problems stated above. Specifically, it would be beneficial to provide an electrode arrangement with well-aligned electrodes and at the same time with a reduced risk of arcing due to the high potential differences between the electrodes. Further, it would be beneficial to provide charged particle beam devices with such an electrode arrangement and methods of reducing an electrical field strength in an electrode arrangement.

SUMMARY

In light of the above, an electrode arrangement, a contact assembly for an electrode arrangement, a charged particle beam device with an electrode arrangement, and a method of reducing an electric field strength in an electrode arrangement according to the independent claims are provided. Further aspects, advantages, and features are apparent from the dependent claims, the description, and the accompanying drawings.

According to one aspect, an electrode arrangement for acting on a charged particle beam is provided. The electrode arrangement includes: a first electrode with a first opening for the charged particle beam; a first spacer element positioned in a first recess provided in the first electrode on a first electrode side for aligning the first electrode relative to a second electrode, the first spacer element having a first blind hole; a first conductive shield provided in the first blind hole; and a contact assembly protruding from the first electrode into the first blind hole for providing an electrical contact between the first electrode and the first conductive shield.

The first spacer element may be an insulating sphere or ball, particularly a ceramic ball, that may be sandwiched between the first electrode and a second electrode for accurately positioning the first electrode and the second electrode relative to each other. Even if the more general term "spacer element" is used in the following specification, it is to be noted that spacer elements described herein are typically insulating balls or insulating spheres, particularly ceramic balls that may have a diameter of, e.g., 10 mm.

In some embodiments, the contact assembly includes a first contact element extending into the first blind hole for electrically contacting the first conductive shield, and a second contact element extending into a second blind hole of a second spacer element that is positioned on a second electrode side for electrically contacting a second conductive shield provided in the second blind hole. Optionally, a spring element may act between the first contact element and the second contact element that pushes the first contact element and the second contact element apart.

Further described is a contact assembly for an electrode arrangement for acting on a charged particle beam, particularly for an electrode arrangement according to any of the embodiments described herein. The contact assembly includes: a first contact element configured to extend from a first electrode into a first blind hole of a first spacer element for electrically contacting a first conductive shield provided in the first blind hole; a second contact element configured to extend from the first electrode into a second blind hole of a second spacer element for electrically contacting a second conductive shield provided in the second blind hole; and a spring element acting between the first contact element and the second contact element and pushing the first contact element and the second contact element apart into opposite directions.

According to another aspect, a charged particle beam device for imaging and/or inspecting a specimen is provided. The charged particle beam device includes a charged particle beam source for generating a charged particle beam propagating along an optical axis; a beam influencing element including an electrode arrangement according to any of the embodiments described herein; an objective lens device for focusing the charged particle beam onto the specimen; and a detector for detecting signal charged particles emitted by the specimen.

In some embodiments, the charged particle beam device is an electron microscope, particularly a scanning electron microscope (SEM) with one or more scan deflectors for scanning the primary charged particle beam over a surface of the specimen.

According to one aspect, a method of reducing an electric field strength in an electrode arrangement is provided, particularly an electrode arrangement according to any of the embodiments described herein. The method includes generating a charged particle beam propagating along an optical axis; directing the charged particle beam through an electrode arrangement including at least a first electrode provided on a first electric potential, a second electrode provided on a second electric potential, and a first spacer element sandwiched between the first electrode and the second electrode for aligning the first electrode and the second electrode relative to each other; and bending electrical field lines away from a point of contact between the first electrode and the first spacer element with a first conductive shield provided in a first blind hole of the first spacer element, wherein a contact assembly protruding into the first blind hole provides an electrical contact between the first conductive shield and the first electrode.

Embodiments are also directed at apparatuses for carrying out the disclosed methods and include apparatus parts for performing each described method feature. The method features may be performed by way of hardware components, a computer programmed by appropriate software, by any combination of the two or in any other manner. Furthermore, embodiments are also directed at methods of manufacturing the described apparatuses and methods of operating the described apparatuses. It includes method features for carrying out every function of the apparatus.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments, one or more examples of which are illustrated in the figures. Within the following description, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Without limiting the scope of the present application, in the following, the charged particle beam device or components thereof will exemplarily be referred to as an electron beam device configured for the detection of signal electrons. The signal electrons particularly encompass secondary electrons and/or backscattered electrons, specifically both secondary and backscattered electrons (SEs and BSEs). However, it is to be understood that embodiments described herein can be applied for devices and components detecting other corpuscles such as secondary and/or backscattered charged particles in the form of ions in order to obtain a sample image or inspection or processing result. Accordingly, in embodiments described herein, charged particles are not limited to electrons.

An "electrode arrangement" as used herein is a beam optical component or a part thereof that is configured to influence a charged particle beam, such as an electrode beam, with electrodes that can be set on predetermined electric potentials. For example, an electrode arrangement may include two, three or more electrodes that are arranged subsequently along a charged particle beam path in a charged particle beam device. An electrode arrangement described herein may be a part of any of an electrostatic or magnetic lens, an electrostatic or magnetic mirror, an electrostatic or magnetic deflector, or another electrostatic or magnetic other component that acts on a charged particle beam via electrostatic and/or magnetic fields. Electrode arrangements may be used in charged particle beam devices like charged particle beam microscopes, e.g. a scanning electron microscope (SEM), a transmission electron microscope (TEM), a scanning transmission microscope (STEM), or a device that uses the charged particle beams to structure a specimen like, e.g. an electron beam pattern generator used to structure a lithographic mask, or a focused ion beam device (FIB) to slice or mill a specimen.

Figure 1:
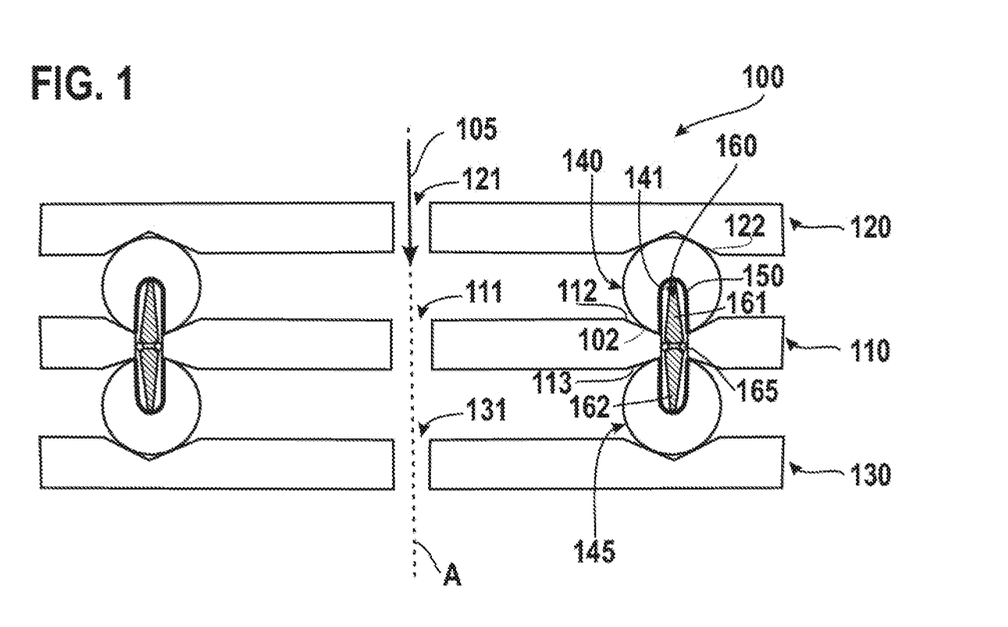
FIG. 1 is a schematic sectional view of an electrode arrangement according to embodiments described herein.

FIG. 1 shows an electrode arrangement 100 for acting on a charged particle beam 105. The charged particle beam 105 may propagate along an optical axis A through the electrode arrangement 100. The electrode arrangement 100 includes a first electrode 110 with a first opening 111 for the charged particle beam, and the first opening 111 may be coaxially aligned with the optical axis A of the electrode arrangement 100. In some embodiments, the first electrode 110 includes two, three or more openings for a plurality of charged particle beamlets that may propagate through the openings of the first electrode along respective optical axes. The first electrode 110 can be set on an electric potential for influencing the charged particle beam 105 in a predetermined way, e.g., on a static or varying electric potential.

In some embodiments, the first electrode 110 is a part of an electrostatic lens or another beam optical component that may include a second electrode 120 and optionally a third electrode 130 that are arranged along the optical axis A. For example, the first electrode 110, the second electrode 120, and the third electrode 130 may form an Einzel lens. The first electrode 110 may be arranged between the second electrode 120 and the third electrode 130 and may therefore also be referred to as a "central electrode". In other words, the second electrode 120 may be arranged upstream of the first electrode 110, and the third electrode 130 may be arranged downstream of the first electrode 110. Each electrode may include at least an opening for the charged particle beam, wherein the openings may be aligned coaxially with respect to each other. The first electrode 110 includes the first opening 111, the second electrode 120 may include a second opening 121, and the third electrode 130 may include a third opening 131, and the openings may be aligned such that the charged particle beam 105 can propagate through the openings along the optical axis A. In some embodiments, each electrode includes a plurality of openings for a plurality of beamlets that can propagate through the electrode arrangement.

The first electrode 110 (and, similarly, also the other electrodes of the electrode arrangement 100) may include a plate of a conductive material, e.g. a metal. The first opening 111 may be coaxially aligned with respect to the optical axis A with a precision of 100 µm or less, in particular 5 µm or less.

The first electrode 110 and the second electrode 120 may be positioned at a predetermined distance from each other along the optical axis A via a first spacer element 140 that is sandwiched between the first electrode 110 and the second electrode 120. The first spacer element 140 may be positioned in a first recess 112 that is provided in the first electrode 110 for aligning the first electrode 110 relative to the second electrode 120. The first spacer element 140 may ensure an accurate relative positioning between the first electrode 110 and the second electrode 120 in the direction along the optical axis A (also referred to herein as the axial direction A), and also an accurate relative positioning in the plane perpendicular to the optical axis A (i.e., in a radial direction and/or in a circumferential direction of the first electrode 110). Accordingly, the first spacer element 140 may ensure a correct alignment of the second electrode 120 relative to the first electrode 110, such that the first opening 111 is coaxially aligned with the second opening 121.

The first spacer element 140 may be made of an insulating material, such that the first electrode 110 and the second electrode 120 are electrically isolated from each other and can be provided on different electric potentials. In some embodiments, the first spacer element 140 may be an insulating ball or insulating sphere that is positioned in the first recess 112 provided in the first electrode 110 and in a second electrode recess 122 provided in the second electrode 120. The first recess 112 (and the second electrode recess 122) may be shaped such that the first spacer element 140 formed as an insulating sphere arranges at one specific predetermined position in the first recess 112 (and at one specific predetermined position in the second electrode recess 122). For example, the first recess 112 and/or the second electrode recess 122 may be conical recesses.

Figure 3A:
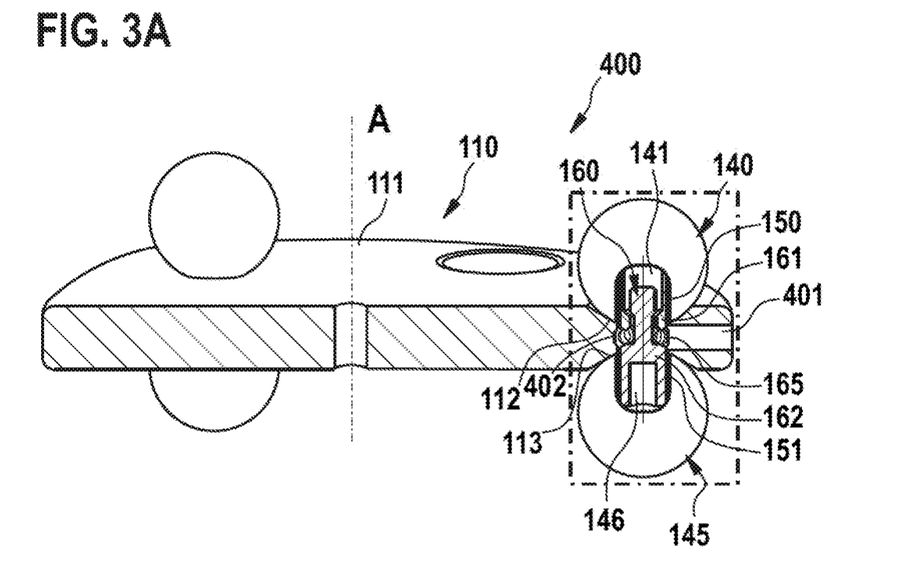
FIG. 3A is a partially perspective and partially sectional view of an electrode arrangement according to embodiments described herein.

In order to align the second electrode 120 relative to the first electrode 110 with a high precision and a high degree of parallelism, at least three spacer elements formed as insulating spheres may be sandwiched between the first electrode 110 and the second electrode 120 (two of which are depicted in FIG. 1 on opposite sides of the optical axis A; FIG. 3A shows the positions of all three spacer elements). Each of the three spacer elements may be positioned in respective recesses provided in the first electrode and in the second electrode for aligning the first electrode and the second electrode relative to each other. For example, the three spacer elements may be arranged at evenly distributed angular positions with respect to a center of the first electrode 110 (e.g., an angle of 120° may be enclosed between two adjacent spacer elements as viewed from the optical axis A, respectively). The three spacer elements arranged in respective recesses of the first and second electrodes that are sandwiched between the first and second electrodes may ensure an accurate alignment of the second electrode relative to the first electrode in all relevant dimensions, i.e. axially and in the plane perpendicular to the axial direction A. Specifically, the first opening 111 and the second opening 121 may be aligned coaxially with respect to the optical axis A with an accuracy of 5 µm or better, and the distance between the first electrode and the second electrode may correspond to a predetermined distance with an accuracy of 5 µm or better.

In some embodiments, the three spacer elements may be spherically shaped bodies made of an insulating material. In order to provide a high degree of parallelism between the first electrode 110 and the second electrode 120, the diameters of the spherically shaped bodies may differ from each other by less than 1/1000, particularly by less than 1/10000. For example, if the diameter of the first spacer element 140 in FIG. 1 is nominally 10 mm, the diameter of the spacer element on the other side of the optical axis A may deviate by less than 10 µm or by less than 1 µm from the nominal diameter. The fabrication of spheres made of, e.g., $Al_2O_3$ or other ceramic materials with such high geometric precision is well known. In some embodiments, the first spacer element 140 and/or the other spacer elements are ceramic spheres with a diameter of 10 mm.

As will be now explained with reference to FIGS. 6, 7A, and 7B, sandwiching spacer elements formed as insulating spheres between two electrodes may lead to high electric field strengths and may therefore increase the risk of arcing.

Figure 6:
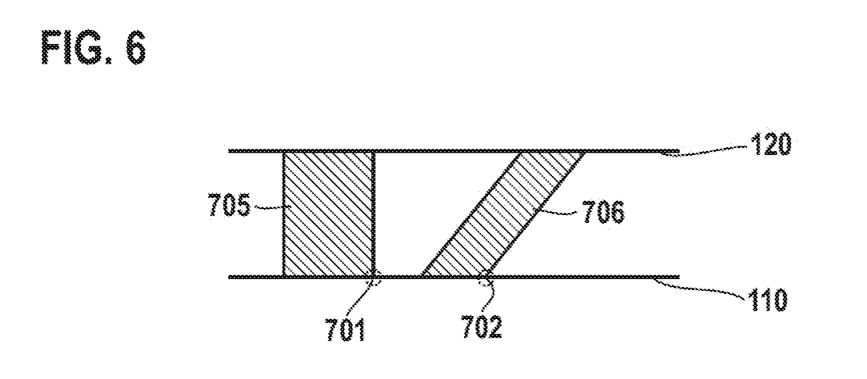
FIG. 6 is a schematic view of an electrode arrangement for illustrating the position of triple points.

FIG. 6 schematically illustrates a first electrode 110 arranged at a close distance from a second electrode 120, wherein a first spacer element 705 and a second spacer element 706 made of insulating materials are arranged between and in contact with the first electrode 110 and the second electrode 120. Accordingly, a high voltage system including two electrodes on different electric potentials is provided that are in contact with an insulator or dielectric material. A "triple point" is defined as a junction of metal, dielectric material, and vacuum. In FIG. 6, a first triple point 701 is schematically illustrated at a junction between the first electrode 110, the first spacer element 705, and vacuum, and a second triple point 702 is schematically illustrated at a junction between the first electrode 110, the second spacer element 706, and vacuum.

The electric field strength around triple points may be greatly enhanced depending on the geometry and the material properties of the involved components, particularly depending on the geometry of the spacer element. This makes triple points critical locations to initiate arcing in vacuum environments. For example, in FIG. 6, the electric field strength at the first triple point 701 is much lower than the electric field strength at the second triple point 702. Generally, if the angle between the insulator and the conducting electrode surface is smaller than 90°, the electric field strength in the vicinity of the triple point will be higher.

The angle between the first electrode 110 and the first spacer element 705 at the first triple point 701 is about 90°, which leads to an electric field strength near the first triple point 701 that is lower than the electric field strength near the second triple point 702 where the angle between the first electrode 110 and the second spacer element 706 is much smaller than 90°.

If a spacer element formed as an insulating sphere is provided between the first electrode 110 and the second electrode 120, particularly in a conical recess provided in the first electrode 110, the involved geometries are unfavorable, since the resulting angle between the insulating sphere and the metal surface of the electrode is much smaller than 90°. Accordingly, the risk of arcing is increased in the vicinity of the respective triple points. However, the extremely high manufacturing precision of insulating spheres guarantees a very accurate alignment of the electrodes relative to each other, such that the involved geometries are beneficially maintained despite the issues related to the resulting triple points described above.

Figure 7A:
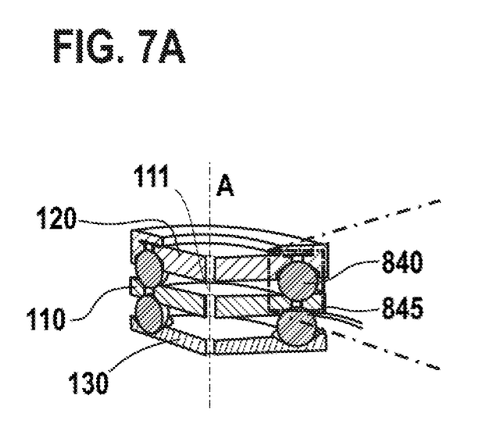
FIG. 7A shows an electrode arrangement with spacer elements without conductive shields provided therein.
Figure 7B:
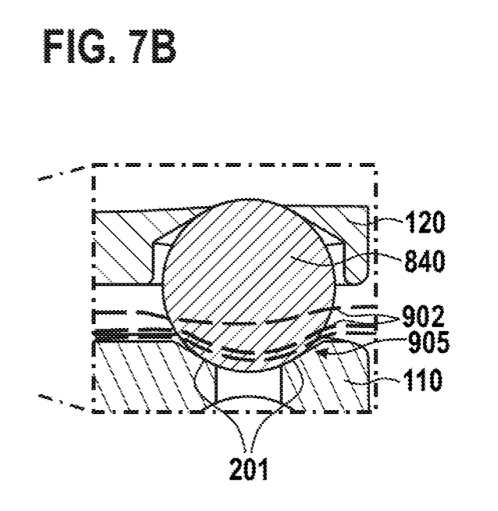
FIG. 7B is an enlarged view of a part of the electrode arrangement of FIG. 7A, illustrating an electrical field strength enhancement at triple points in the electrode arrangement.

FIG. 7A shows a perspective view of an electrode arrangement including a first electrode 110 that is arranged along the optical axis A between a second electrode 120 and a third electrode 130. A first opening 111 for the charged particle beam is provided in the first electrode, and second and third openings coaxially aligned with the first opening 111 are provided in the second and third electrodes. FIG. 7B shows an enlarged view of a part of the electrode arrangement of FIG. 7A, illustrating an electrical field strength enhancement at the triple points 201.

The first electrode 110 and the second electrode 120 are aligned relative to each other via first insulating balls 840 arranged in conical recesses of the first electrode 110 and the second electrode 120, respectively, and the first electrode 110 and the third electrode 130 are aligned relative to each other via second spherical balls 845 arranged in conical recesses of the first electrode 110 and the third electrode 130, respectively. As is depicted in detail in FIG. 7B, the angles between the surface of the first electrode 110 and the first insulating balls 840 at the triple points 201 are very small, which may lead to an enhanced electric field strength in a field enhancement zone 905 in the vicinity of the triple points 201. In FIG. 7B, the enhanced electric field strength is illustrated by a small distance between electric field lines 902 in the vicinity of the triple points 201. Accordingly, the use of conventional insulating spheres as spacer elements may increase the risk of arcing in electrode arrangements.

Embodiments described in the present disclosure relate to an electrode arrangement that allows an accurate alignment of several electrodes relative to each other with insulating spacer elements while at the same time reducing the risk of arcing due to an enhanced electric field strength at the triple points.

Returning now to FIG. 1, the first spacer element 140 of the electrode arrangement 100 has a first blind hole 141 that extends into the first spacer element 140. A first conductive shield 150 is provided in the first blind hole 141. Further, a contact assembly 160 protrudes from the first electrode 110 into the first blind hole 141 for providing an electrical contact between the first electrode 110 and the first conductive shield 150.

The first conductive shield 150 may be understood as a component or layer made of a conductive material that is arranged in the first blind hole 141 of the first spacer element 140 and is brought into electrical contact with the first electrode 110 and, hence, on the same electric potential as the first electrode 110. Further, the first conductive shield 150 is shaped and arranged such that electrical field lines are bent away from the first recess of the first electrode by the first conductive shield 150, and the electrical field strength in the vicinity of the contact area between the first electrode and the first spacer element is reduced.

The contact assembly 160 is provided for ensuring a reliable electrical contact between the first conductive shield 150 and the first electrode 110. Since the first conductive shield 150 is thus on the first electric potential of the first electrode 110 and is arranged inside the first blind hole of the first spacer element 140, the first conductive shield 150 causes a bending of the electric field lines away from the first recess 112 of the first electrode 110 in which the first spacer element 140 is positioned. Accordingly, the electric field strength in the vicinity of a triple point 102 where the first spacer element 140 is in contact with the first electrode 110 can be reduced and a field enhancement zone in the vicinity of the triple point 102 can be avoided.

The first conductive shield 150 is arranged in the first blind hole 141 and configured to bend electric field lines away from the first recess 112. Accordingly, the risk of arcing due to a field enhancement zone near the triple point 102 can be reduced. In embodiments described herein, the first spacer element 140 is positioned in the first recess 112 in an orientation such that the open end of the first blind hole 141 faces toward the first recess 112. Accordingly, the contact assembly 160 can extend from the first recess 112 into the first blind hole 141 for establishing a reliable electric contact between the first electrode 110 and the first conductive shield 150.

In some embodiments, the first conductive shield 150 may conform in shape with and/or lie in close contact to an inner wall of the first blind hole 141. In particular, the first conductive shield 150 may cover a major part of or the whole inner wall surface of the first blind hole. The first conductive shield 150 may lie close to the inner wall of the first blind hole 141, such that no spaces or gaps are provided between the inner wall of the first blind hole 141 and the first conductive shield 150. Spaces between the first conductive shield and the inner wall of the first blind hole may potentially generate new triple points, i.e. new junctions of metal, dielectric and vacuum, and hence new positions of potential field enhancements, such that such spaces are beneficially reduced or avoided.

In some embodiments, which can be combined with other embodiments described herein, the first conductive shield 150 may cover 80% or more, particularly 90% or more of the inner wall surface of the first blind hole 141. Specifically, essentially the entire inner wall surface of the first blind hole 141 may be covered by the first conductive shield 150. This reduces the risk of generating new triple points at positions inside the first blind hole.

For example, the first conductive shield 150 may be a conductive layer that is provided on the inner wall surface of the first blind hole 141, particularly coated on the inner wall surface of the first blind hole 141. The conductive layer or metallization may cover essentially the whole inner wall surface of the first blind hole in some embodiments. The open end of the first blind hole 141 may face toward the first recess 112 and may be arranged at a close distance from the first electrode 110, and the first conductive shield 150 may be a coating that covers the inner wall surface of the first blind hole up to the open end of the first blind hole 141. Accordingly, there may be an essentially seamless transition between the first conductive shield 150 and the first electrode 110, such that no new triple points are created by the first conductive shield 150.

The first spacer element 140 may be an insulating sphere, and the first blind hole 141 may include a channel that extends into the first spacer element 140. In particular, the channel may extend in a radial direction centrally into the insulating sphere. The channel may have a length corresponding to 30% or more, particularly 40% or more, or even 50% or more of a diameter of the first spacer element 140. If the channel extends far into the first spacer element 140, the first conductive shield 150 that covers the inner channel wall can urge regions of high electric field strength far away from the triple points 102. However, if the channel extends too far into the first spacer element 140, the first conductive shield 150 that covers the inner channel wall may potentially generate another field enhancement region in the area between the closed end of the first blind hole 141 and the second electrode 120. The reason is that the full electric potential difference between the first electrode 110 and the second electrode 120 drops in the area between the first conductive shield 150 (that is on the potential of the first electrode 110) and the second electrode 120. Accordingly, the channel may have a length corresponding to 70% or less, particularly 60% or less of the diameter of the first spacer element 140. In some embodiments, the channel extends into the insulating sphere by 30% or more and 70% or less of the diameter of the insulating sphere.

The channel may be an essentially cylindrical channel, particularly a channel having a round or circular cross-sectional shape. A blind hole with a cylindrically shaped channel can be easily and reliably coated with a conductive coating for providing the first conductive shield 150, reducing the risk of generating new triple points and field enhancement zones.

For example, the first spacer element 140 may be an insulating sphere with a diameter of 10 mm, and the first blind hole may have a depth of 4 mm or more and 6 mm or less. The first blind hole may be drilled into the first spacer element 140 with a round drill. In some embodiments, which can be combined with other embodiments described herein, the first blind hole 141 includes an essentially cylindrical channel with a conductively coated channel wall that extends into the first spacer element 140 and has a length corresponding to 40% or more and 70% or less of the diameter of the first spacer element 140.

In particular, the first blind hole may be metallized to ensure that no (air) gaps are provided between the conductive shield and the first spacer element that may create new triple points. The metallization does beneficially cover only the inner wall of the first blind hole, but not the outer wall of the first spacer element, since a metal on the outer surface of the first spacer element could create a new triple point and potentially new field enhancement regions.

In implementations described herein, the contact assembly 160 is provided for ensuring an electrical contact between the first electrode 110 and the first conductive shield 150. Accordingly, the first conductive shield 150 is electrically connected with the first electrode 110 and, hence, provided on the first electrode potential. In some embodiments, the contact assembly 160 includes a first contact element 161 configured to electrically contact the first conductive shield 150. The first contact element 161 may protrude into the first blind hole 141 and may be urged into contact with the first conductive shield 150. In particular, a spring element 165 may be provided for pushing the first contact element 161 into electrical contact with the first conductive shield 150. For example, the first contact element 161 may be pressed into the first blind hole 141 via the spring element 165 into electrical contact with the metallized inner wall of the first blind hole 141.

In some embodiments, which can be combined with other embodiments described herein, the contact assembly 160 includes the spring element 165 and the first contact element 161. The spring element 165 may be arranged between the first electrode 110 and the first contact element 161, ensuring an electrical contact between the first electrode 110 and the first contact element 161. Further, the spring element 165 may urge the first contact element 161 into electrical contact with the first conductive shield 150 that is provided in the first blind hole 141. Accordingly, a reliable electrical contact between the first electrode 110 and the first conductive shield 150 is provided by the contact assembly 160.

In some embodiments, which can be combined with other embodiments described herein, the contact assembly 160 may connect the first spacer element 140 to the first electrode 110 while maintaining a movability of the first spacer element 140 relative to the first electrode 110. Specifically, the first spacer element 140 may be movably held in the first recess 112 of the first electrode, even if the contact assembly 160 establishes an electrical contact between the first electrode 110 and the first conductive shield 150 by projecting into the first blind hole 141. Maintaining a movability between the first spacer element 140 and the first electrode 110 even in an assembled state is beneficial, because the first spacer element 140 can correctly self-align relative to the first recess 112 and relative to the second electrode recess 122 when placed in the first recess 112 and in the second electrode recess 122 of the second electrode 120. An accurate alignment of the first electrode 110 relative to the second electrode 120 can be ensured.

Specifically, the contact assembly 160 may allow a movement of the first spacer element 140 relative to the first electrode 110 in the axial direction A even in an assembled state, allowing an automatic self-adjustment of a predetermined axial distance between the first electrode 110 and the second electrode 120 when the first spacer element 140 is positioned between the first electrode and the second electrode in the first recess 112 and in the second electrode recess 122, respectively. Alternatively or additionally, the contact assembly 160 may allow a movement of the first spacer element 140 relative to the first electrode 110 in a plane perpendicular to the optical axis A, i.e. in a radial direction of the first electrode and/or in a circumferential direction of the first electrode, allowing an automatic self-adjustment of the first opening 111 at a predetermined co-axial position relative to the second opening 121 along the optical axis A, when the first spacer element 140 is positioned between the first electrode and the second electrode in the first recess 112 and in the second electrode recess 122, respectively.

Specifically, the contact assembly 160 may be configured such that an electrical contact between the first electrode 110 and the first conductive shield 150 is ensured in an assembled state, while the first spacer element 140 is not immovably fixed to the first electrode but rather positioned movably relative to the first electrode in the first recess, maintaining the possibility of self-alignment in the assembled stated.

In some embodiments, which can be combined with other embodiments described herein, the electrode arrangement 100 further includes a second spacer element 145 that is positioned in a second recess 113 provided in the first electrode 110 on a second electrode side opposite the first electrode side for aligning the first electrode 110 relative to the third electrode 130. The second spacer element 145 may have a second blind hole 146, and a second conductive shield 151 may be provided in the second blind hole 146. The second spacer element 145 and the second conductive shield 151 may include the above features of the first spacer element 140 and the first conductive shield 150, such that reference can be made to the above explanations, which are not repeated here. Specifically, the second conductive shield 151 may be a conductive coating provided on the inner wall surface of the second blind hole 146.

The contact assembly 160 may extend from the first electrode 110 both into the first blind hole 141 and into the second blind hole 146. The contact assembly 160 may extend into the first blind hole 141 for providing an electrical contact between the first electrode 110 and the first conductive shield 150, and the contact assembly 160 may extend into the second blind hole 146 for providing an electrical contact between the first electrode 110 and the second conductive shield 151.

In some implementations, the first recess 112 and the second recess 113 that are provided in the first electrode 110 on opposite electrode sides may be connected by a through hole extending through the first electrode 110, e.g. parallel to the optical axis A. The contact assembly 160 may extend through the through hole into both the first blind hole 141 and the second blind hole 146. In particular, the contact assembly may electrically contact an inner wall of the through hole of the first electrode, and may electrically contact both the first conductive shield 150 in the first blind hole 141 and the second conductive shield 151 in the second blind hole 146.

Specifically, the contact assembly 160 may include a first contact element 161 for contacting the first conductive shield 150 and a second contact element 162 for contacting the second conductive shield 151 that is arranged in the second blind hole 146 of the second spacer element 145 on the second electrode side. Optionally, the contact assembly 160 may further include a spring element 165 that pushes the first contact element 161 and the second contact element 162 apart from each other in the axial direction A. The spring element 165 may push the first contact element 161 into electrical contact with the first conductive shield 150 and may push the second contact element 162 into electrical contact with the second conductive shield 151. Accordingly, a reliable electrical contact between the first electrode and both the first and second conductive shields is ensured.

Similar to the first spacer element 140, the second spacer element 145 can ensure an accurate alignment of the first electrode 110 relative to the third electrode 130, particularly in the axial direction A and/or in a plane perpendicular to the axial direction. Further, the second conductive shield 151 that is provided on the potential of the first electrode 110 can reduce the electrical field strength in the vicinity of triple points between the first electrode and the second spacer element, reducing the risk of arcing. Reference is made to the above explanations which also apply, mutatis mutandis, to the second spacer element 145 that acts between the first electrode 110 and the third electrode 130.

In an alternative embodiment (not shown in the figures), the contact assembly may include a conductive flexible element, e.g. a coil or spring element, that is compressible in a direction along the optical axis A and presses against the first conductive shield and/or against the second conductive shield. The conductive flexible element may be in electrical contact with the first electrode and with the first and/or second conductive shield. For example, the contact assembly may be comprised of one single flexible component, particularly a coil spring, that establishes an electrical contact between the first electrode and the first conductive shield (and optionally also the second conductive shield) and has a distal end that is flexibly pressed against the first conductive shield.

In one example, the contact assembly may be comprised of one single flexible component, particularly a coil spring, that establishes an electrical contact between the first electrode, the first conductive shield and the second conductive shield. The single flexible component may have two opposite ends that flexibly press against the first conductive shield and the second conductive shield, i.e. the flexible component may be slightly compressed between the first and second conductive shields in an assembled state. For example, the contact assembly may include a spring element, e.g. comprised of one bended wire, having a center part and two conical ends. The center part may be arranged in a through hole of the first electrode such as to be in contact with the first electrode, and the two conical ends may protrude to both sides of the first electrode, such that the two conical ends allow electrical contacts to the first and second conductive shields inside the insulating spheres.

Figure 2:
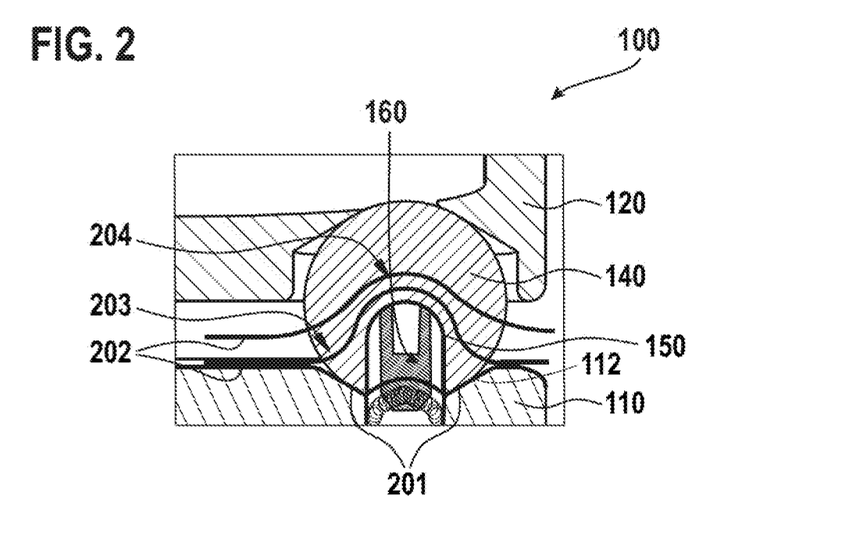
FIG. 2 is an enlarged view of a part of the electrode arrangement of FIG. 1, illustrating an electrical field in the electrode arrangement.

FIG. 2 is an enlarged view of a part of the electrode arrangement 100 of FIG. 1, illustrating the electrical field strength in the electrode arrangement in the vicinity of triple points 201 between the first electrode 110 and the first spacer element 140. The first electrode 110 is provided on a first electric potential different from a second electric potential of the second electrode 120. For example, at least one of the first and second electrodes is set on a high voltage potential. Since the first conductive shield 150 is electrically connected to the first electrode 110 via the contact assembly 160, also the first conductive shield 150 is provided on the first electric potential of the first electrode 110. Accordingly, the electrical field strength in the vicinity of the triple points 201 can be reduced (illustrated by the enlarged distance between adjacent electric field lines 202 in the vicinity of the triple points 201, providing a field reduction region 203 near the triple points 201).

The electrical field lines 202 are bent away from the first recess 112 in which the first spacer element 140 is placed toward the space beyond the first conductive shield 150. A field enhancement region 204 may be generated in a space between the first conductive shield 150 and the second electrode 120. By appropriately choosing the depth and shape of the first blind hole and the first conductive shield in the first spacer element 140, the maximum electrical field strength in the vicinity of the first spacer element 140 can be reduced, and the risk of arcing can be decreased.

Figure 3B:
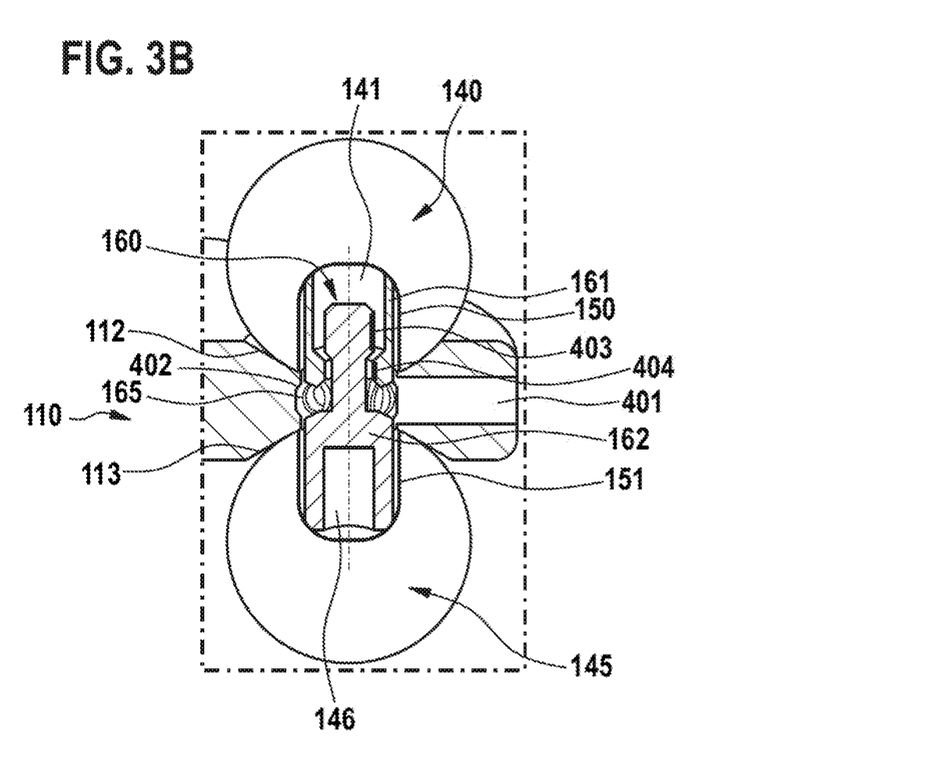
FIG. 3B is an enlarged view of a part of the electrode arrangement of FIG. 3A.

FIG. 3A is a perspective view of an electrode arrangement 400 according to embodiments described herein, and FIG. 3B is an enlarged sectional view of a part of the electrode arrangement of FIG. 3A. The electrode arrangement 400 may include some features or all the features of the electrode arrangement 100 depicted in FIG. 1 and FIG. 2, such that reference can be made to the above explanations, which are not repeated here.

The electrode arrangement 400 includes a first electrode 110 with a first opening 111 for the charged particle beam, such that the charged particle beam can propagate through the first opening 111 of the first electrode 110 along an optical axis A in an axial direction. A first spacer element 140, particularly a ceramic ball, is positioned in a first recess 112 provided in the first electrode on a first electrode side for aligning the first electrode 110 relative to a second electrode (not depicted in FIG. 3A), and a second spacer element 145, particularly a ceramic ball, is positioned in a second recess 113 provided in the first electrode 110 on a second electrode side opposite the first electrode side for aligning the first electrode 110 relative to a third electrode (not depicted in FIG. 3A). The first recess 112 and the second recess 113 may be connected by a through hole 402 that extends through the first electrode 110 in the axial direction.

A first conductive shield 150 is provided in a first blind hole 141 of the first spacer element 140, and a second conductive shield 151 is provided in a second blind hole 146 of the second spacer element 145. The first conductive shield 150 and/or the second conductive shield 151 may cover essentially the entire inner wall surface of the respective blind hole, e.g., 90% or more of the inner wall surface. In particular, the first conductive shield 150 and/or the second conductive shield 151 may be conductive coatings, such as metal coatings, covering the inner wall surfaces of the first blind hole 141 and the second blind hole 146, respectively.

A contact assembly 160 protrudes from the first electrode 110 into the first blind hole 141 for providing an electrical contact between the first electrode 110 and the first conductive shield 150. The contact assembly 160 may further protrude from the first electrode 110 into the second blind hole 146 for providing an electrical contact between the first electrode 110 and the second conductive shield 151. For example, the contact assembly 160 may be held in the through hole 402 that connects the first recess 112 and the second recess 113, and may protrude from the through hole 402 into two opposite directions along the optical axis A. A first end of the contact assembly 160 may protrude into the first blind hole 141 for contacting the first conductive shield 150 provided therein, and a second opposite end of the contact assembly 160 may protrude into the second blind hole 146 for contacting the second conductive shield 151 provided therein.

Optionally, an evacuation channel 401 may provide a fluid connection between the through hole 402 and the surroundings of the electrode arrangement. The evacuation channel 401 may extend from the through hole 402 in a radial direction of the first electrode 110. Accordingly, when the electrode arrangement 400 is arranged in a vacuum chamber of a charged particle beam device that is evacuated, the through hole 402, the first blind hole 141 and the second blind hole 146 quickly evacuate through the evacuation channel 401.

In some embodiments, which can be combined with other embodiments described herein, the contact assembly 160 includes a first contact element 161 for contacting the first conductive shield 150 and a second contact element 162 for contacting the second conductive shield 151. The first contact element 161 may be movable relative to the second contact element 162, particularly in the axial direction A and/or by tilting the first contact element 161 relative to the second contact element 162. A movability of the first contact element 161 and the second contact element 162 ensures a reliable electric contact between the contact elements and the respective conductive shield independently of each other. Further, it is ensured that the first spacer element 140 and the second spacer element 145 can self-align in the respective recesses independently of each other, even if electrically contacted by the contact assembly 160.

In some embodiments, the contact assembly 160 further includes a spring element 165 that pushes the first contact element 161 and the second contact element 162 apart from each other in the axial direction A. The first contact element 161 may be pushed into the first blind hole 141 into electrical contact with the first conductive shield 150, and the second contact element 162 may be pushed into the second blind hole 146 into electrical contact with the second conductive shield 151.

In some embodiments, which can be combined with other embodiments described herein, the spring element 165 electrically contacts the first electrode 110 and acts between an axial end or a shoulder of the first contact element 161 and an axial end or a shoulder of the second contact element 162. In the embodiment depicted in FIG. 3A and FIG. 3B, the spring element 165 is arranged between an axial end of the first contact element 161 and a shoulder of the second contact element 162, pushing the first contact element 161 and the second contact element 162 apart in the axial direction A.

For example, the spring element 165 may be a coil spring, particularly a toroidal coil spring, that surrounds at least one of the first contact element 161 and the second contact element 162 and is provided in the through hole 402 that extends through the first electrode 110 from the first recess 112 to the second recess 113. In the embodiment depicted in FIG. 3A and FIG. 3B, the spring element 165 is a toroidal coil spring that surrounds the second contact element 162 and acts between a shoulder of the second contact element 162 and an axial end of the first contact element 161.

In some embodiments, the spring element 165 is conductive and provides the electrical contact between the first electrode 110 and the first and/or second contact element. Since the spring element 165 is elastically deformable, said electrical contact is maintained, even if any of the first and second contact elements should be moved and/or tilted, e.g. due to a movement of the first and/or second spacer elements. Particularly, the spring element 165 may be fitted in an annular space that is provided between an inner wall of the through hole 402 and a pin section of one of the contact elements. More specifically, the spring element 165 may be fitted in an annular space that is delimited axially by a shoulder of the second contact element 162 and an axial end of the first contact element 161 and that is delimited radially by the inner wall of the through hole 402 and the pin section of the second contact element 162. Naturally, the roles of the first and second contact elements can be exchanged.

In some embodiments, the spring element 165, the first contact element 161, and the second contact element 162 are made of a conductive material. The spring element 165 may directly contact the first electrode, the first contact element 161, and the second contact element 162, ensuring that the contact assembly 160 is maintained on the first electric potential of the first electrode, even if any of the first and second contact elements are moved or tilted relative to the first electrode 110 and/or relative to each other.

In some embodiments, the second contact element 162 includes a pin section with a head part that protrudes into a sleeve section of the first contact element 161, or vice versa. Accordingly, the first contact element 161 and the second contact element 162 are held together in a compact arrangement while allowing at least an axial movability between the first contact element 161 and the second contact element 162 by shifting the pin section of the second contact element 162 into or out of the sleeve section of the first contact element 161, or vice versa. The outer diameter of the pin section may be 80% or less of the inner diameter of the sleeve section, allowing a restricted tilting movement of the first contact element 161 relative to the second contact element 162, even if the head part protrudes into the sleeve part.

In some embodiments, the second contact element 162 is movable and captive with respect to the first contact element 161. In other words, the first contact element 161 and the second contact element 162 are movably held together or movably connected to each other, such that the contact assembly 160 constitutes a cohesive arrangement of parts that does not fall apart even if the contact assembly 160 is removed from or provided separately from the first electrode 110.

In implementations, the head part of the second contact element 162 is screwed through an internal thread of the first contact element 161, or vice versa. For example, the head part of the second contact element 162 is provided with an external thread 403, and a constriction section of the sleeve section of the first contact element 161 is provided with an internal thread 404, such that the head part can be screwed through the constriction section of the sleeve section. After screwing the head part through the constriction section, the head part may be arranged in an expansion section of the sleeve section that has an inner diameter larger than an outer diameter of the head part. Accordingly, the first contact element 161 and the second contact element 162 are movable and at the same time captive relative to each other. For example, in the screwed state, the first contact element 161 and the second contact element 162 can be tilted relative to each other by 1° or more and 10° or less, and/or the first contact element 161 and the second contact element 162 can be axially moved relative to each other by 0.1 mm or more and 3 mm or less.

In some embodiments, which can be combined with other embodiments described herein, the first spacer element 140 and/or the second spacer element 145 are ceramic spheres. The first recess 112 and the second recess 113 may be essentially conical recesses that provide a self-positioning of the ceramic spheres exactly at a predetermined position if the ceramic spheres are arranged in the respective conical recess.

The electrode arrangement 400 may include the first electrode 110, a second electrode aligned relative to the first electrode 110 on a first electrode side, and a third electrode aligned relative to the first electrode on a second electrode side opposite the first electrode side. The electrode arrangement may be an electrostatic lens including at least three electrodes. At least one of the electrodes may be provided on a high voltage potential, e.g. 5 kV or more, particularly a high voltage in a range from 9 kV to 16 kV. For example, the first electrode 110 that is arranged between the second and third electrodes may be provided on a low voltage or may be connected to ground (e.g., 100 V or less), and both the second electrode and the third electrode may be provided on a high voltage (e.g., 5 kV or more, particularly 9 kV or more).

A first distance between the first electrode 110 and the second electrode in the axial direction A may be 10 mm or less, particularly 5 mm or less, or even 3 mm or less, and/or a second distance between the first electrode 110 and the third electrode in the axial direction may be 10 mm or less, particularly 5 mm or less, or even 3 mm or less. Despite the small distances and high potential differences between adjacent electrodes, the risk of arcing in the vicinity of triple points formed between the first electrode and the spacer elements in contact therewith can be reduced or minimized.

According to embodiments described herein, the electric field strength in the vicinity of the triple points can be reduced by 50% or more, or even by up to 80%, as compared to a situation in which no conductive shields are provided inside the insulating spheres.

The following beneficial effects are provided: A conductive shield is provided inside the insulating spheres that bends the electric field lines away from the first electrode in the vicinity of the insulating spheres. A safe electrical contact is provided between the first electrode and the conductive shield by the contact assembly. At the same time, the insulating spheres can "freely" move—in the range of the provided mechanical tolerances—to maintain the alignment and centering properties of the system. Accordingly, an accurately aligned electrode arrangement with a reduced risk of arcing is provided.

The electrode arrangement 400 may include three spacer elements as described herein on each side of the first electrode 110, and three contact assemblies as described herein may extend through the first electrode 110 from a respective first spacer element into a respective second spacer element, as it is schematically depicted in FIG. 3A. Accordingly, the second electrode can be accurately aligned with the first electrode on the first electrode side, and the third electrode can be accurately aligned with the first electrode on the second electrode side.

According to one aspect described herein, a contact assembly 160 for an electrode arrangement for acting on a charged particle beam is provided. The contact assembly 160 includes a first contact element 161 configured to extend from a first electrode into a first blind hole of a first spacer element for electrically contacting a first conductive shield 150 provided in the first blind hole, a second contact element 162 configured to extend from the first electrode into a second blind hole of a second spacer element for electrically contacting a second conductive shield 151 provided in the second blind hole, and a spring element 165 acting between the first contact element 161 and the second contact element 162 and pushing the first contact element 161 and the second contact element 162 into opposite directions along the optical axis A.

The contact assembly 160 may include some or all the features of the contact assemblies disclosed above, such that reference can be made to the above explanations, which are not repeated here. In particular, the contact assembly may be configured in accordance with the contact assembly 160 depicted in FIG. 3B that includes a first contact element 161 with a sleeve section and a second contact element 162 with a pin section having a head part protruding into the sleeve section. Alternatively, the first and second contact elements may be differently shaped, e.g. as correspondingly shaped contact pins that are urged into contact with the respective conductive shield, as it is schematically depicted in FIG. 1.

Figure 4:
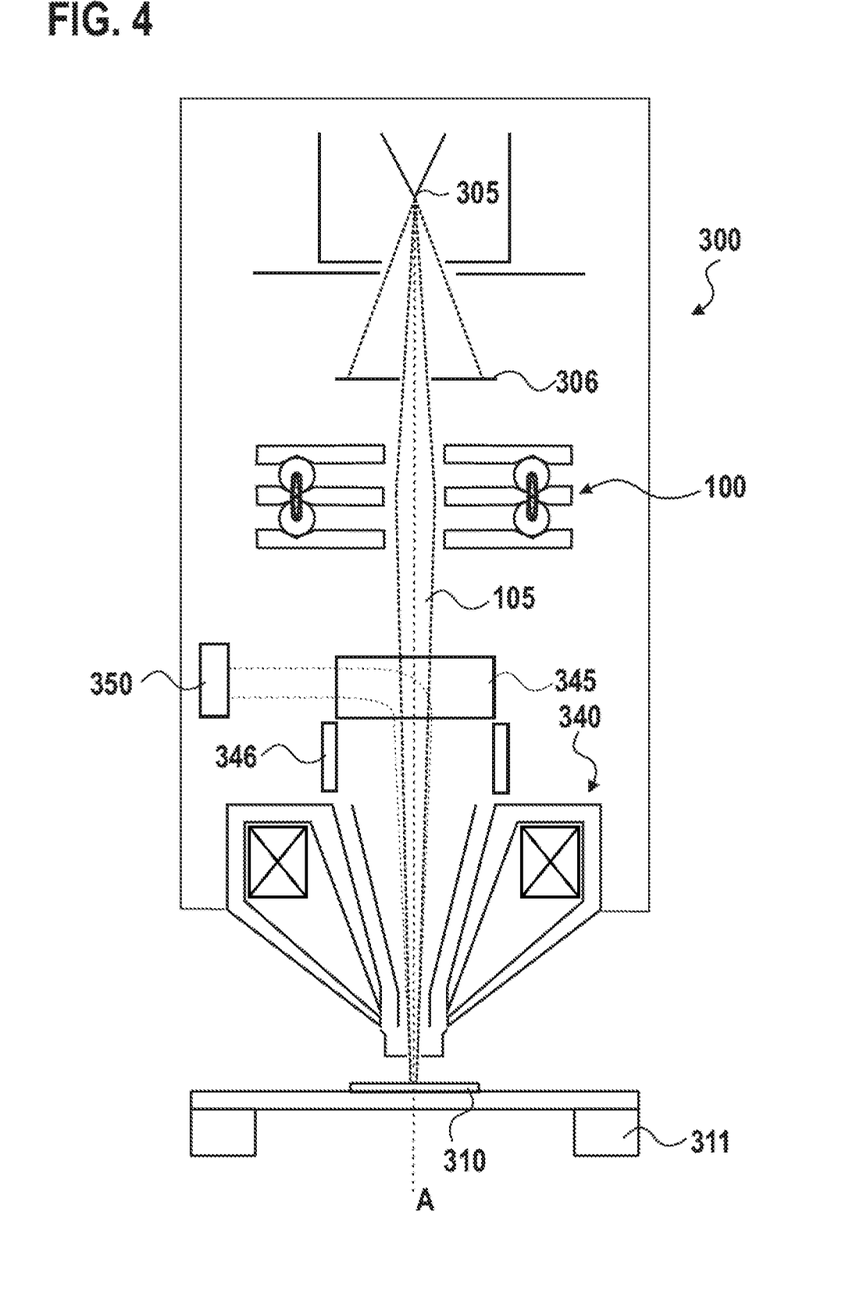
FIG. 4 is a schematic view of a charged particle beam device according to embodiments described herein.

FIG. 4 is a schematic view of a charged particle beam device 300 according to embodiments described herein. The charged particle beam device 300 may be an electron microscope configured to image and/or inspect a specimen, e.g., a wafer.

A "specimen", "sample" or "wafer" as referred to herein includes, but is not limited to, semiconductor wafers, semiconductor workpieces, and other workpieces such as memory disks and the like. A "specimen" may specifically be any workpiece that is structured or on which material is deposited. A specimen, a sample or wafer may include a surface that is to be inspected and/or imaged, e.g. a surface that is structured or on which layers or a material pattern have been deposited. For example, a sample may be a substrate or a wafer on which a plurality of electronic devices is provided that are to be inspected. The charged particle beam device 300 may be configured for at least one of electron beam inspection (EBI), critical dimension measurement and defect review applications, and the devices and methods described herein can be beneficially used to obtain an improved detection accuracy and a reduced risk of imaging errors or other defects. According to some embodiments, an electron beam inspection (EBI), critical dimension measurement (CD) tool, and/or defect review (DR) tool can be provided, wherein high resolution, large field of view, and high scanning speed can be achieved.

The charged particle beam device 300 may include a charged particle beam source 305, e.g. an electron source, for generating a charged particle beam 105 propagating along an optical axis A. The charged particle beam device 300 further includes a beam influencing element that includes an electrode arrangement 100 according to any of the embodiments described herein. The beam influencing element may be an electrostatic lens with, e.g., three electrodes that are subsequently arranged along the optical axis A. The electrode arrangement 100 may be configured in accordance with any of the embodiments described herein, such that reference can be made to the above explanations.

The charged particle beam device 300 is configured to guide the charged particle beam 105 along the optical axis A to a specimen 310 for releasing signal particles from the specimen 310. The specimen 310 may be placed on a specimen stage 311, the specimen stage 311 including a support surface extending essentially in an x-y-plane. The specimen stage 311 may be movable.

The charged particle beam source 305 may be a cold field emitter (CFE), a Schottky emitter, a thermal field emitter (TFE), or a high current and/or high brightness charged particle source, particularly an electron source. A high current is considered to be 5 µA in 100 mrad or above.

According to some embodiments, the charged particle beam device 300 is adapted for guiding the charged particle beam 105 in a column of the charged particle beam device along the optical axis A to the specimen 310 for generating signal particles released from the specimen, the signal particles including secondary particles generated upon impingement and backscattered particles reflected from the specimen. Generally, the charged particle beam 105 travels through the column of the charged particle beam device before hitting the specimen to be imaged and/or inspected. An interior of the column may be evacuated, i.e., the charged particle beam device 300 typically includes a vacuum housing such that the charged particle beam propagates through an environment having sub-atmospheric pressure, e.g. a pressure of 1 mbar or less, particularly $1 \times 10^{-5}$ mbar or less, or even $1 \times 10^{-8}$ mbar or less (ultra-high vacuum). The charged particle beam source 305 and further beam optical components may be arranged inside the vacuum housing of the charged particle beam device.

The charged particle beam device 300 may further include an objective lens device 340 for focusing the charged particle beam 105 onto the specimen 310, and a detector 350 for detecting signal charged particles emitted by the specimen, e.g. secondary electrons and/or backscattered electrons.

The charged particle beam device 300 may include further beam optical components, e.g. a beam separator 345 configured to separate the signal charged particles emitted by the specimen from the primary charged particles of the charged particle beam 105, a scan deflector 346 for scanning the charged particle beam 105 over a surface of the specimen 310, and/or one or more beam limiting apertures 306 with one or more openings for the charged particle beam. In some embodiments, the charged particle beam device 300 is a multi-beamlet device, and the electrode arrangement 100 includes a set of coaxially aligned openings for each of the beamlets. In some embodiments, one or more multipole elements may be provided for at least one of focusing, deflecting, steering and correcting aberrations.

One or more beam influencing elements that include an electrode arrangement 100 as described herein may be provided, e.g. electrostatic and/or magnetic lenses, mirror correctors, electrostatic beam deflectors, and/or electrostatic multipole elements, e.g., quadrupoles, octupoles, or even higher-order multipoles.

Figure 5:
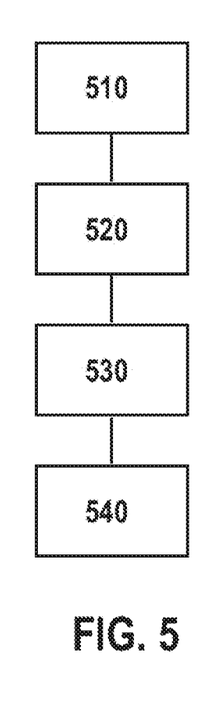
FIG. 5 shows a flow chart illustrating a method of reducing an electric field strength in an electrode arrangement according to embodiments described herein.

FIG. 5 is a flow chart for illustrating a method of reducing an electric field strength in an electrode arrangement according to embodiments described herein.

In box 510, a charged particle beam is generated that propagates along an optical axis A.

In box 520, the charged particle beam is directed through an electrode arrangement that includes a first electrode provided on a first electric potential and a second electrode provided on a second electric potential different from the first electric potential. The electrode arrangement may be an electrostatic lens. A distance between the first electrode and the second electrode along the optical axis A may be 10 mm or less, particularly 5 mm or less, and a potential difference between the first electrode and the second electrode may be 9 kV or more.

A first spacer element, particularly a ceramic ball, is sandwiched between the first electrode and the second electrode and aligns the first electrode and the second electrodes relative to each other. In particular, three spacer elements may be sandwiched between the first electrode and the second electrode for aligning the first electrode and the second electrode relative to each other, particularly for ensuring that the first electrode and the second electrode are parallel to each other and/or have a predetermined distance from each other.

In box 530, electrical field lines are bent away from a point of contact between the first electrode and the first spacer element (more particularly: from a triple point) with a first conductive shield that is provided in a first blind hole of the first spacer element. A contact assembly as described herein may protrude from the first electrode into the first blind hole and provide an electrical contact between the first electrode and the first conductive shield.

In box 540, the charged particle beam 105 may be focused on a specimen, and signal particles emitted by the specimen may be detected by a detector.

The electrode arrangement may further include a third electrode and at least one second spacer element sandwiched between the first electrode and the third electrode and aligning the first electrode and the third electrode relative to each other. In particular, three spacer elements may be sandwiched between the first electrode and the third electrode for aligning the first electrode and the third electrode relative to each other, particularly for ensuring that the first electrode and the third electrode are parallel to each other and/or have a predetermined distance from each other.

According to embodiments described herein, electrical field lines are bent away from a point of contact between the first electrode and the second spacer element (more particularly: a triple point) with a second conductive shield provided in a second blind hole of the second spacer element. The contact assembly may protrude into the second blind hole and provide an electrical contact between the second conductive shield and the first electrode. Accordingly, the contact assembly electrically contacts both the first conductive shield and the second conductive shield with the first electrode, bending electrical field lines away from triple points on both sides of the first electrode.

The method may further include pushing a first contact element of the contact assembly into the first blind hole into electrical contact with the first conductive shield and pushing a second contact element of the contact assembly into the second blind hole into electrical contact with the second conductive shield, e.g. with a spring element that acts between the first contact element and the second contact element.

The first contact element and the second contact element may be captive relative to each other, i.e. the first contact element may be held at the second contact element while maintaining a movability of the contact elements relative to each other.

The electrode arrangement as described herein can be mounted as follows: The contact assembly may be arranged in a through hole of the first electrode, such that the first contact element and the second contact element project from opposite surfaces of the first electrode into opposite directions along the optical axis A. The first spacer element may be placed on the first contact element, such that the first contact element protrudes into the first blind hole, and the second spacer element may be placed on the second contact element, such that the second contact element protrudes into the second blind hole. The first contact element and the second contact element are pushed together against the biasing force of the spring element when the first electrode is placed between the second and third electrodes, ensuring an electrical contact of the contact elements and the conductive shields. The spring element further ensures an electrical contact between the first electrode and the first and second contact elements.

While the foregoing is directed to embodiments, other and further embodiments may be devised without departing from the basic scope, and the scope thereof is determined by the claims that follow.

The invention claimed is:

1. An electrode arrangement for acting on a charged particle beam, comprising:
   a first electrode with a first opening for the charged particle beam;
   a first spacer element positioned in a first recess provided in the first electrode on a first electrode side for aligning the first electrode relative to a second electrode, the first spacer element having a first blind hole;
   a first conductive shield provided in the first blind hole for bending electrical field lines away from the first recess of the first electrode; and
   a contact assembly protruding from the first electrode into the first blind hole for providing an electrical contact between the first electrode and the first conductive shield.

2. The electrode arrangement according to claim 1, wherein the first conductive shield covers 90% or more of an inner wall surface of the first blind hole or an entire inner wall surface of the first blind hole.

3. The electrode arrangement according to claim 1, wherein the first conductive shield is a conductive layer coated on an inner wall surface of the first blind hole.

4. The electrode arrangement according to claim 1, wherein the first blind hole comprises a cylindrical channel extending into the first spacer element and having a length corresponding to 30% or more, 40% or more, or 50% or more of a diameter of the first spacer element.

5. The electrode arrangement according to claim 1, wherein the contact assembly comprises a first contact element and a spring element that pushes the first contact element into the first blind hole to be in electrical contact with the first conductive shield.

6. The electrode arrangement according to claim 1, wherein the contact assembly connects the first spacer element to the first electrode while maintaining a movability of the first spacer element relative to the first electrode in at least one of an axial direction (A) of the electrode arrangement, a radial direction of the first electrode and a circumferential direction of the first electrode.

7. The electrode arrangement according to claim 1, further comprising:
   a second spacer element positioned in a second recess provided in the first electrode on a second electrode side opposite the first electrode side for aligning the first electrode relative to a third electrode, the second spacer element having a second blind hole; and
   a second conductive shield provided in the second blind hole,
   wherein the contact assembly extends from the first electrode into the second blind hole for providing electrical contact between the first electrode and the second conductive shield.

8. The electrode arrangement according to claim 7, wherein the first recess and the second recess are connected by a through hole extending through the first electrode, the contact assembly electrically contacting an inner wall of the through hole and extending through the through hole into both the first blind hole and the second blind hole.

9. The electrode arrangement according to claim 1, wherein the contact assembly includes a first contact element for contacting the first conductive shield and a second contact element for contacting a second conductive shield provided in a second blind hole of a second spacer element arranged on a second electrode side.

10. The electrode arrangement according to claim 9, wherein the contact assembly further comprises a spring element that pushes the first contact element and the second contact element apart from each other in an axial direction (A) of the electrode arrangement.

11. The electrode arrangement according to claim 10, wherein the spring element electrically contacts the first electrode and acts between an axial end or a shoulder of the first contact element and an axial end or a shoulder of the second contact element.

12. The electrode arrangement according to claim 10, wherein the spring element is a coil spring that surrounds at least one of the first and second contact elements and is provided in a through hole that extends through the first electrode.

13. The electrode arrangement according to claim 9, wherein the second contact element comprises a pin section with a head part that protrudes into a sleeve section of the first contact element, or vice versa.

14. The electrode arrangement according to claim 9, wherein the second contact element is movable and captive with respect to the second contact element, particularly wherein a head part of the second contact element is screwed through an internal thread of the first contact element.

15. The electrode arrangement according to claim 1, wherein the first spacer element is a ceramic sphere, and wherein the electrode arrangement is an electrostatic lens comprising at least three electrodes.

16. A contact assembly for an electrode arrangement for acting on a charged particle beam, comprising:
   a first contact element configured to extend from a first electrode into a first blind hole of a first spacer element for electrically contacting a first conductive shield provided therein, wherein the first conductive shield reduces electrical field strength in a vicinity of a contact area between the first spacer element and the first electrode;

a second contact element configured to extend from the first electrode into a second blind hole of a second spacer element for electrically contacting a second conductive shield provided therein, wherein the second conductive shield reduces electrical field strength in a vicinity of a contact area between the second spacer element and the first electrode; and a spring element acting between the first contact element and the second contact element and pushing the first contact element and the second contact element apart into opposite directions.

17. A charged particle beam device, comprising:

a charged particle beam source for generating a charged particle beam propagating along an optical axis;

a beam influencing element comprising the electrode arrangement according to claim 1;

an objective lens device for focusing the charged particle beam onto a specimen; and a detector for detecting signal charged particles emitted by the specimen.

18. A method of reducing an electrical field strength in an electrode arrangement for acting on a charged particle beam, comprising:

generating a charged particle beam propagating along an optical axis;

directing the charged particle beam through an electrode arrangement comprising at least a first electrode provided on a first electric potential, a second electrode provided on a second electric potential, and a first spacer element sandwiched between the first electrode and the second electrode and aligning the first electrode and the second electrode relative to each other; and bending electrical field lines away from a point of contact between the first electrode and the first spacer element with a first conductive shield provided in a first blind hole of the first spacer element, wherein a contact assembly protruding into the first blind hole provides an electrical contact between the first conductive shield and the first electrode.

19. The method of claim 18, wherein the electrode arrangement further comprises at least a third electrode and a second spacer element sandwiched between the first electrode and the third electrode and aligning the first electrode and the third electrode relative to each other, further comprising:

bending electrical field lines away from a point of contact between the first electrode and the second spacer element with a second conductive shield provided in a second blind hole of the second spacer element, wherein the contact assembly protrudes into the second blind hole and provides electrical contact between the second conductive shield and the first electrode.

20. The method of claim 19, further comprising: pushing a first contact element of the contact assembly into the first blind hole into electrical contact with the first conductive shield and a second contact element of the contact assembly into the second blind hole into electrical contact with the second conductive shield.

* * * * *